(12) United States Patent
Stapleton et al.

(10) Patent No.: US 9,026,067 B2
(45) Date of Patent: May 5, 2015

(54) REMOTELY RECONFIGURABLE POWER AMPLIFIER SYSTEM AND METHOD

(75) Inventors: Shawn P. Stapleton, Burnaby (CA); Albert S. Lee, San Mateo, CA (US)

(73) Assignee: Dali Systems Co. Ltd., George Town, Grand Cayman (KY)

( * ) Notice: Subject to any disclaimer, the term of this patent is extended or adjusted under 35 U.S.C. 154(b) by 0 days.

(21) Appl. No.: 12/767,669

(22) Filed: Apr. 26, 2010

(65) Prior Publication Data

US 2010/0271957 A1   Oct. 28, 2010

Related U.S. Application Data

(63) Continuation-in-part of application No. 12/108,502, filed on Apr. 23, 2008.

(60) Provisional application No. 60/925,603, filed on Apr. 23, 2007, provisional application No. 61/172,642, filed on Apr. 24, 2009.

(51) Int. Cl.
*H04B 1/04* (2006.01)
*H03F 1/32* (2006.01)
*H03F 3/24* (2006.01)

(52) U.S. Cl.
CPC ............... *H03F 1/3247* (2013.01); *H03F 3/24* (2013.01); *H03F 2200/204* (2013.01); *H03F 2201/3224* (2013.01); *H03F 2201/3233* (2013.01)

(58) Field of Classification Search
USPC ............... 455/424, 425, 456.5, 456.6, 550.1, 455/575.1, 92, 418, 419, 67.11, 126, 127.1, 455/115.3, 114.3, 115.1, 127.3; 330/2, 10, 330/254; 375/297, 310; 370/242
See application file for complete search history.

(56) References Cited

U.S. PATENT DOCUMENTS

| 4,638,248 A | 1/1987 | Schweickert |
|---|---|---|
| 4,700,151 A | 10/1987 | Nagata |

(Continued)

FOREIGN PATENT DOCUMENTS

| CN | 1462153 A | 12/2003 |
|---|---|---|
| CN | 1288341 A | 6/2006 |

(Continued)

OTHER PUBLICATIONS

Office Action for corresponding Japanese Application No. 2010-506483 dated Oct. 9, 2012, 8 pages.

(Continued)

*Primary Examiner* — Yuwen Pan
*Assistant Examiner* — Fatuma Sherif
(74) *Attorney, Agent, or Firm* — Kilpatrick Townsend & Stockton LLP

(57) ABSTRACT

A system and method for remotely monitoring, communicating with, and reconfiguring power amplifier systems. A communications link is provided in field-deployed PA systems, for enabling remote communication with appropriate digital components such as microprocessors or other communications-capable portions of the power amplifier systems. The communications link permits operating parameters of the PA to be monitored and sent back to a remote terminal such as a web server or other computer mainframes via any suitable wired or wireless connection including internet, Ethernet, wireless, WiFi, WiMAX, cellular, local area networks (LAN), wide area networks (WAN), Bluetooth, and so forth. The communication is bi-directional, so that the remote host can download to the PA updates, cMobile operators and/or other service providers can reduce significant operating and capital expenses related to their radio networks maintenance and PA replacement by practicing this invention.

12 Claims, 4 Drawing Sheets

(56) References Cited

U.S. PATENT DOCUMENTS

| | | |
|---|---|---|
| 4,890,300 A | 12/1989 | Andrews |
| 4,929,906 A | 5/1990 | Voyce et al. |
| 5,049,832 A | 9/1991 | Cavers |
| 5,121,412 A | 6/1992 | Borth |
| 5,132,639 A | 7/1992 | Blauvelt et al. |
| 5,396,190 A | 3/1995 | Murata |
| 5,486,789 A | 1/1996 | Palandech et al. |
| 5,579,342 A | 11/1996 | Crozier |
| 5,675,287 A | 10/1997 | Baker et al. |
| 5,678,198 A | 10/1997 | Lemson |
| 5,732,333 A | 3/1998 | Cox et al. |
| 5,757,229 A | 5/1998 | Mitzlaff |
| 5,786,728 A | 7/1998 | Alinikula |
| 5,920,808 A * | 7/1999 | Jones et al. ............... 455/127.1 |
| 5,936,464 A | 8/1999 | Grondahl |
| 5,937,011 A | 8/1999 | Carney et al. |
| 5,949,283 A | 9/1999 | Proctor et al. |
| 5,959,499 A | 9/1999 | Khan et al. |
| 5,963,549 A | 10/1999 | Perkins et al. |
| 6,054,896 A | 4/2000 | Wright et al. |
| 6,055,418 A | 4/2000 | Harris et al. |
| 6,091,941 A | 7/2000 | Moriyama et al. |
| 6,141,390 A | 10/2000 | Cova |
| 6,166,601 A | 12/2000 | Shalom et al. |
| 6,240,144 B1 | 5/2001 | Ha |
| 6,242,979 B1 | 6/2001 | Li |
| 6,246,286 B1 | 6/2001 | Persson |
| 6,246,865 B1 | 6/2001 | Lee |
| 6,275,685 B1 | 8/2001 | Wessel et al. |
| 6,301,579 B1 | 10/2001 | Becker |
| 6,315,189 B1 * | 11/2001 | Williams ................... 228/180.1 |
| 6,400,774 B1 | 6/2002 | Matsuoka et al. |
| 6,424,225 B1 | 7/2002 | Choi et al. |
| 6,430,402 B1 * | 8/2002 | Agahi-Kesheh ........... 455/115.3 |
| 6,512,417 B2 | 1/2003 | Booth et al. |
| 6,552,609 B2 | 4/2003 | Hamada et al. |
| 6,552,634 B1 | 4/2003 | Raab |
| 6,566,944 B1 * | 5/2003 | Pehlke et al. ................... 330/10 |
| 6,625,429 B1 * | 9/2003 | Yamashita ................... 455/126 |
| 6,639,050 B1 | 10/2003 | Kieliszewski |
| 6,639,463 B1 * | 10/2003 | Ghanadan et al. ........ 330/124 R |
| 6,639,466 B2 * | 10/2003 | Johnson ....................... 330/149 |
| 6,677,870 B2 | 1/2004 | Im et al. |
| 6,697,436 B1 | 2/2004 | Wright et al. |
| 6,703,897 B2 | 3/2004 | O'Flaherty et al. |
| 6,741,663 B1 | 5/2004 | Tapio et al. |
| 6,747,649 B1 | 6/2004 | Sanz-Pastor et al. |
| 6,751,447 B1 | 6/2004 | Jin et al. |
| 6,794,931 B2 | 9/2004 | Kenington |
| 6,963,242 B2 | 11/2005 | White et al. |
| 6,983,025 B2 | 1/2006 | Schell |
| 6,985,704 B2 | 1/2006 | Yang et al. |
| 7,031,749 B1 * | 4/2006 | Mitama ....................... 455/556.1 |
| 7,035,345 B2 | 4/2006 | Jeckeln et al. |
| 7,042,287 B2 | 5/2006 | Robinson |
| 7,061,314 B2 | 6/2006 | Kwon et al. |
| 7,064,606 B2 | 6/2006 | Louis |
| 7,079,818 B2 | 7/2006 | Khorram |
| 7,102,442 B2 * | 9/2006 | Anderson ....................... 330/285 |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffel |
| 7,109,998 B2 | 9/2006 | Smith |
| 7,151,913 B2 | 12/2006 | Ahmed |
| 7,158,765 B2 | 1/2007 | Blair et al. |
| 7,193,471 B2 * | 3/2007 | Tsutsui et al. ................. 330/285 |
| 7,193,472 B2 | 3/2007 | Gotou et al. |
| 7,248,642 B1 | 7/2007 | Vella-Coleiro |
| 7,259,630 B2 | 8/2007 | Bachman et al. |
| 7,301,402 B2 * | 11/2007 | Norris et al. .................. 330/298 |
| 7,321,635 B2 | 1/2008 | Ocenasek et al. |
| 7,321,636 B2 | 1/2008 | Harel et al. |
| 7,372,918 B2 | 5/2008 | Muller et al. |
| 7,409,007 B1 | 8/2008 | Johnson et al. |
| 7,469,491 B2 | 12/2008 | McCallister et al. |
| 7,493,094 B2 * | 2/2009 | Ichitsubo et al. ........... 455/127.1 |
| 7,593,710 B2 * | 9/2009 | Brigaud et al. ............. 455/343.5 |
| 7,702,300 B1 * | 4/2010 | McCune ....................... 455/108 |
| 7,826,810 B2 * | 11/2010 | Carmel et al. ............. 455/127.2 |
| 7,831,221 B2 | 11/2010 | Leffel et al. |
| RE42,287 E | 4/2011 | Apodaca et al. |
| 8,149,950 B2 | 4/2012 | Kim et al. |
| 8,213,884 B2 | 7/2012 | Kim et al. |
| 8,401,499 B2 | 3/2013 | Kim et al. |
| 8,509,347 B2 | 8/2013 | Kim et al. |
| 8,548,403 B2 | 10/2013 | Kim et al. |
| 2002/0034260 A1 | 3/2002 | Kim |
| 2002/0044014 A1 * | 4/2002 | Wright et al. ....................... 330/2 |
| 2002/0080891 A1 | 6/2002 | Ahn et al. |
| 2002/0097085 A1 * | 7/2002 | Stapleton ........................ 330/10 |
| 2002/0101937 A1 | 8/2002 | Antonio et al. |
| 2002/0101938 A1 | 8/2002 | Horaguchi et al. |
| 2002/0158689 A1 * | 10/2002 | Harris et al. .................. 330/129 |
| 2002/0186783 A1 | 12/2002 | Opas et al. |
| 2002/0187761 A1 | 12/2002 | Im et al. |
| 2002/0193085 A1 | 12/2002 | Mathe et al. |
| 2003/0095608 A1 | 5/2003 | Duperray |
| 2003/0179829 A1 | 9/2003 | Pinckley et al. |
| 2003/0179830 A1 | 9/2003 | Eidson et al. |
| 2003/0207680 A1 | 11/2003 | Yang et al. |
| 2003/0234688 A1 | 12/2003 | Matsuyoshi et al. |
| 2004/0017859 A1 | 1/2004 | Sills et al. |
| 2004/0032912 A1 | 2/2004 | Ocenasek et al. |
| 2004/0212428 A1 | 10/2004 | Ode et al. |
| 2004/0240585 A1 | 12/2004 | Bishop et al. |
| 2005/0059360 A1 | 3/2005 | Kenington |
| 2005/0079834 A1 | 4/2005 | Maniwa et al. |
| 2005/0159117 A1 | 7/2005 | Bausov et al. |
| 2005/0262498 A1 | 11/2005 | Ferguson et al. |
| 2006/0012426 A1 | 1/2006 | Nezami |
| 2006/0012427 A1 * | 1/2006 | Nezami ........................ 330/149 |
| 2006/0141957 A1 * | 6/2006 | Fischer et al. ................ 455/119 |
| 2006/0214729 A1 | 9/2006 | Furuya et al. |
| 2006/0270366 A1 * | 11/2006 | Rozenblit et al. ........... 455/127.1 |
| 2007/0075780 A1 | 4/2007 | Krvavac et al. |
| 2007/0171234 A1 | 7/2007 | Crawfis et al. |
| 2007/0241812 A1 | 10/2007 | Yang |
| 2007/0264947 A1 * | 11/2007 | Rozenblit et al. ........... 455/127.2 |
| 2008/0068191 A1 * | 3/2008 | Maeda et al. .................. 340/635 |
| 2008/0152037 A1 | 6/2008 | Kim et al. |
| 2008/0240286 A1 * | 10/2008 | Zhang et al. .................. 375/296 |
| 2008/0265996 A1 | 10/2008 | Kim et al. |
| 2009/0013317 A1 * | 1/2009 | Abfalter et al. ............... 717/170 |
| 2009/0088093 A1 * | 4/2009 | Nentwig ..................... 455/114.3 |
| 2009/0213972 A1 * | 8/2009 | Maunuksela et al. ......... 375/371 |
| 2012/0147993 A1 | 6/2012 | Kim et al. |
| 2012/0230382 A1 | 9/2012 | Kim et al. |
| 2013/0214861 A1 | 8/2013 | Kim et al. |

FOREIGN PATENT DOCUMENTS

| | | |
|---|---|---|
| CN | 1838530 A | 9/2006 |
| CN | 2012-525093 A | 10/2012 |
| CN | 200880021049.8 | 3/2014 |
| EP | 2 430 531 | 3/2012 |
| IN | 8527/CHENP/2011 A | 3/2013 |
| JP | H09-284149 | 10/1997 |
| JP | 2000-092412 A | 3/2000 |
| JP | 2000-278237 A | 10/2000 |
| JP | 2001-244757 A | 9/2001 |
| JP | 2001-217885 A | 10/2001 |
| JP | 2002-536902 A | 10/2002 |
| JP | 2003-304122 A | 10/2003 |
| JP | 2006-340166 | 12/2006 |
| WO | WO 00/46916 A1 | 8/2000 |
| WO | WO 2004/040870 A1 | 5/2004 |
| WO | WO 2006/025213 A1 | 3/2006 |
| WO | WO 2008/154077 A1 | 12/2008 |
| WO | WO 2010/124297 A1 | 10/2010 |

OTHER PUBLICATIONS

Office Action for corresponding Chinese Application No. 200880021049.8 dated Mar. 28, 2012, 10 pages.

(56) References Cited

OTHER PUBLICATIONS

Second Office Action for corresponding Chinese Application No. 200880021049.8 dated Dec. 4, 2012, 8 pages.
Non-Final Office Action for U.S. Appl. No. 12/108,502 mailed on Jul. 23, 2009, 33 pages.
Final Office Action for U.S. Appl. No. 12/108,502 mailed on Apr. 14, 2010, 15 pages.
Non-Final Office Action for U.S. Appl. No. 12/108,502 mailed on Dec. 29, 2010, 27 pages.
Final Office Action for U.S. Appl. No. 12/108,502 mailed on Sep. 23, 2011, 32 pages.
Extended European Search Report for corresponding European Application No. 10767899.7 dated Mar. 14, 2013, 6 pages.
Notice of Allowance for U.S. Appl. No. 12/108,502 mailed on Feb. 6, 2014, 12 pages.
English Translation and First Office Action for corresponding Chinese Application No. 201080025887.X dated Nov. 22, 2013, 14 pages.
English Translation and Final Office Action for corresponding Japanese Application No. 2010-506483 dated Jan. 17, 2014, 5 pages.
English Translation and Office Action for corresponding Japanese Application No. 2012-507473 dated Feb. 25, 2014, 6 pages.
English Translation and Office Action for corresponding Japanese Application No. 2010-506483 dated Jan. 10, 2012, 6 pages.
International Search Report and Written Opinion of PCT/US2008/061355 mailed on Aug. 4, 2008, 6 pages.
English Translation and Office Action for corresponding Japanese Application No. 2010-506483 dated Jun. 4, 2013, 6 pages.
English Translation and Third Office Action for corresponding Chinese Application No. 200880021049.8 dated Jun. 20, 2013, 14 pages.
English Translation and Office Action for corresponding Japanese Application No. 2012-507473 dated Dec. 2, 2014, 7 pages.

\* cited by examiner

REMOTELY RECONFIGURABLE POWER AMPLIFIER SYSTEM AND METHOD

CROSS REFERENCE TO RELATED APPLICATIONS

This is a continuation-in-part and claims the benefit of U.S. patent application Ser. No. 12/108,502, entitled "Digital Hybrid Mode Power Amplifier System," filed Apr. 23, 2008, and through it U.S. Pat. Appn. Ser. No. U.S. 60/925,603, filed on Apr. 23, 2007, and further claims the benefit of U.S. Provisional Application Ser. No. 61/172,642 filed Apr. 24, 2009, both of which are hereby incorporated by reference in their entirety for all purposes.

BACKGROUND OF THE INVENTION

1. Field of the Invention

The present invention generally relates to wireless communication systems using complex modulation techniques. More specially, the present invention relates to single and multi-carrier power amplifier systems that contain a microprocessor or other similar digital components, such as a Field Programmable Gate Array (FPGA) or Application Specific Integrated Circuit (ASIC).

2. The Prior Art

A wideband mobile communication system using complex modulation techniques such as wideband code division access (WCDMA) and orthogonal frequency division multiplexing (OFDM) has a large peak-to-average power ratio (PAPR) and requires a high linearity of the base-station's power amplifiers (PA). The conventional feedforward linear power amplifier (FFLPA) has been widely utilized due to its excellent linearity performance in spite of poor power efficiency. In order to overcome this poor efficiency, digital baseband predistortion (PD) has been demonstrated due to the recent advances in digital signal processors. A Doherty power amplifier (DPA) has also been applied to these linearization systems to maximize the power efficiency. The variation of the linearity performance of the amplifier due to the environment changing such as temperature and the asymmetric distortion of the output signal of the amplifier resulting from memory effects also needs to be compensated.

Conventional high power amplifiers (HPA), FFLPA, and DPA are known to fail frequently with mean time between failures (MTBF) from a few months to a few years. Low power efficiency means most of the energy is dissipated in the form of heat. Since most electronic components are known to be vulnerable to thermal damage, this significant thermal heat generated by the conventional PA systems is generally perceived to be one of the main cause of PA failures.

A failed PA would ordinarily cause the related base-station, repeater, or other transmission systems to stop functioning. Since a typical mobile operator or service provider depends on its voice and/or data traffic for revenues, a failed PA could be costly to its mobile operator in terms of loss revenue and questionable radio network reliability. Currently, conventional PA systems have local alarm features such as lights, audio indicators, displays, and etc. that signal a system failure. Mobile operators often have to react to such failures by sending technicians to replace the failed PAs after the failures were discovered in their radio networks. In some cases, mobile operators would measure a radio network technician's career performance in terms of "seconds" of a base-station or network downtime. In such cases, those network technicians are typically incentivized with cash bonus compensation to replace failed PA systems as soon as the latter are discovered. In other cases, some mobile operators implement a pre-emptive policy of replacing all PA systems after well less than the expected product lifetime, even though the PA systems were functioning perfectly well. This policy, of course, can be wasteful and inefficient.

Aside from PA failures, rapid advancements in mobile communications have also induced rapid changes in mobile communication systems such as modulation scheme evolutions, communication equipment firmware updates, radio frequency front-end systems enhancements, and etc. Conventional digital baseband PD systems are usually tailored to a specific wireless modulation scheme, such as CDMA, CDMA2000 EVDO, UMB, OFDM, WCDMA, TDS-CDMA, GSM, EDGE, etc., with a specific set of specifications such as PAPR, error vector magnitude (EVM), adjacent channel power ratio (ACPR), operating radio frequency, bandwidth, and etc. Usually, any updates or changes in specifications require an update of digital baseband PD systems, or in some cases, a wholesale replacement of the entire PA system. The high cost and labor intensity of making such updates and changes have driven up significantly the cost of capital equipment upgrades, and in turn, reduced the mobile operators' desire to deploy most state-of-art wireless technology in their radio networks for the end users among the general public.

Hence, a need remains for remotely monitoring the power amplifier performance and providing an advance indication or prediction when a power amplifier will fail. A need also remains for enabling a power amplifier already deployed in radio networks to be upgraded or enhanced via software upgrades, especially those managed remotely. Such features would save mobile operators significant operating and capital expenses relating to radio networks maintenance and PA replacement. If such an arrangement existed, mobile operators could also deploy the latest wireless technology for the general end users while preserving their existing capital investments.

SUMMARY OF THE INVENTION

Accordingly, the present invention has been made in view of the above problems, and it is an object of the present invention to provide an efficient and effective method of remotely communicating with, monitoring and upgrading power amplifier systems. To achieve the above objectives, according to the present invention, remote connectivity such as internet, Ethernet, wireless, WiFi, WiMAX, cellular, local area networks (LAN), wide area networks (WAN), Bluetooth, and etc. (collectively, the "Remote Media"), is added to the power amplifier systems.

The present invention is applicable to any power amplifier systems that have software defined radio (SDR) capability, such as digital signal processing, digital PD, and etc. In an embodiment, a communication link is established between a microprocessor (or other digital components) of a PA system and a remote computer terminal or command centre through the Remote Media. Depending upon the embodiment, the microprocessor (or other digital components such as digital sensors) inside the PA systems is configured to measure the operating conditions of functioning PA systems such as temperature, gain, current, voltage, time, time-delay, in-phase and/or quadrature baseband signal (I and Q Signals), coefficients of the PA amplitude-amplitude (AM-AM) and/or amplitude-phase (AM-PM) curves, coefficients of the PD look-up table and/or algorithms, frequency, bandwidth, transistor junction temperatures, non-linearities, and other tangible physical characteristics. In an embodiment, the values measured by microprocessor are recorded, processed, and/or transmitted real-time or non-real-time, and can be stored in the microprocessor's onboard or external memory. Any suitable networking protocol, such as TCP/IP, and standard microprocessor interfacing features are implemented to transmit or receive information to-and-from the microprocessor (or other digital components) and the remote system. The PA's microprocessor then communicates the monitored data to a remote host such as a web server or computing mainframe to synthesize, digest, monitor, display, evaluate, calculate, compute, update, compare, send, direct, redirect, download, upload, etc. the data collected from the microprocessor(s) in the PA system(s).

More specifically, failing PA systems are known to exhibit abnormal electrical current characteristics. A Field Programmable Gate Array (FPGA) or Application Specific Integrated Circuit (ASIC) that incorporates a processor, such as a Power PC or Microblaze, controls the data flow to and from the Remote Media. In terms of standard networking protocol, an Ethernet MAC can be used to send and receive packets using TCP/IP networking. A computer network server, or host, such as a web server can be used to establish the remote communication to the power amplifier, while allowing the end user or an automated management program to monitor the PA status. In the case of remote upgrading the software of the PA system, the remote server can upload a software patch or a complete new operating system or kernel via the Remote Media to the microprocessor and perform a remote restart or reboot of the PA system, thereby remotely upgrading the system.

BRIEF DESCRIPTION OF DRAWINGS

Further objects and advantages of the invention can be more fully understood from the following detailed description taken in conjunction with the accompanying drawings in which.

DETAILED DESCRIPTION OF THE INVENTION

The present invention applies standard networking protocol and interface procedures to power amplifier systems that have digital operations capability through microprocessors in the PA systems. In particular, the invention provides system operators the ability to remotely reconfigure PA's within their network to accommodate improvements in the performance of the PA. The remote connection enables upgrades, adjustments, and/or changes as requested by the mobile operators and/or service providers. The remote connection also enables remote monitoring of the performance of the power amplifier. The method provided by the present invention is referred as the remotely reconfigurable power amplifier (RRPA) system hereafter.

Preferred embodiments of the RRPA system according to the present invention will now be described in detail with reference to the accompanying drawings.

Figure 1:
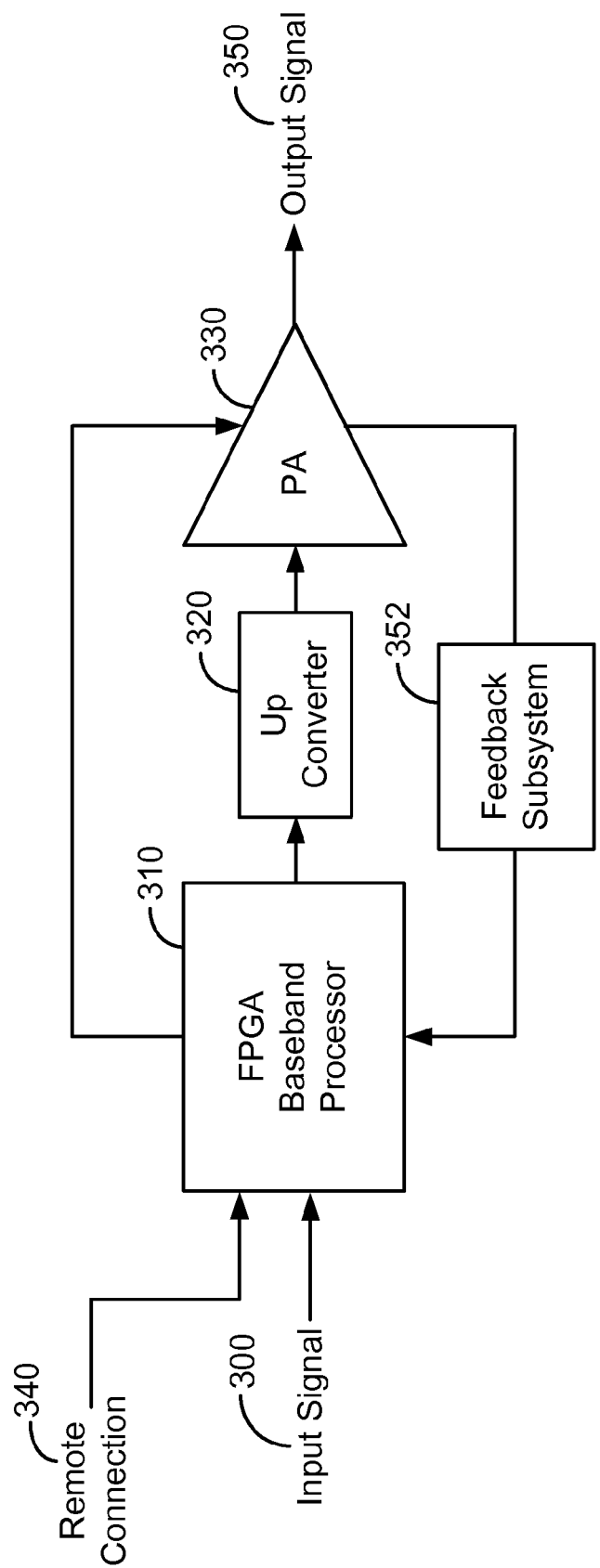
FIG. 1 is a block diagram showing a remotely monitorable and reconfigurable power amplifier system for base-station and repeater applications.

Referring first to FIG. 1, there is shown therein in block diagram form an embodiment of an RRPA system in accordance with the invention. The RRPA system for base-station applications receives a multi-carrier digital signal 300 at the input and generates an RF signal 350 at the output, respectively. In an embodiment, the RRPA system comprises an FPGA-based digital subsystem 310, an up-converter subsystem 320 and a power amplifier subsystem 330. It will be appreciated by those skilled in the art that the subsystem 310 need not be FPGA-based, and that term is used herein merely for clarity and simplicity.

In an embodiment, the FPGA-based digital subsystem 310 comprises a field programmable gate array (FPGA), digital-to-analog converters (DACs), analog-to-digital converters (ADCs), and a phase-locked loop (PLL). In the FPGA subsystem 310, crest factor reduction (CFR), digital filtering and predistortion (PD) are implemented, and the FPGA subsystem 310 is SDR-capable. An input/output 340 into the FPGA-subsystem provides bidirectional communication with a remote host, not shown, which can be a web server or other network server, and other suitable hosting system. Feedback subsystem 352 provides to the FPGA subsystem 310 data regarding the operating characteristics of the PA, including temperature, gain, current, voltage, time, time-delay, in-phase and/or quadrature baseband signal (I and Q Signals), coefficients of the PA amplitude-amplitude (AM-AM) and/or amplitude-phase (AM-PM) curves, coefficients of the PD look-up table and/or algorithms, frequency, bandwidth, transistor junction temperatures, non-linearities, and other tangible physical characteristics.

Figure 2:
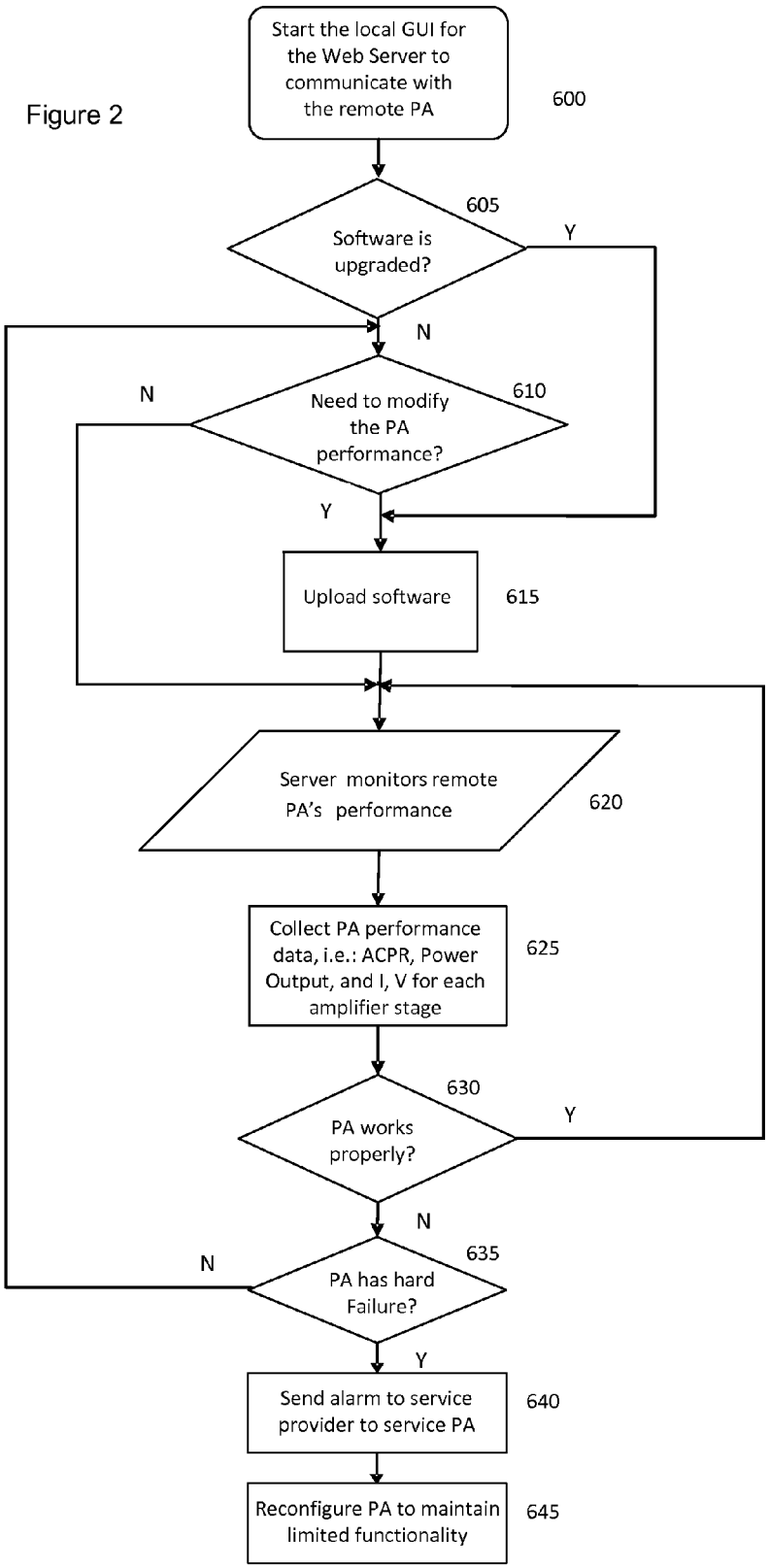
FIG. 2 is a flow chart of a method for communicating with the power amplifier of the present invention.

FIG. 2 shows in flow chart form a method for managing communications between a host and a power amplifier in accordance with the present invention. At step 600, the local GUI is started at the host to enable the host/web server to communicate with the PA. Then, at step 605, a check is made to determine whether the PA software needs to be updated. If not, the process advances to step 610 and check is made to determine whether the PA's performance needs to be modified. If the answer is yes at either step 605 or 610, the process advances to step 615 and appropriate software is uploaded from the server to the PA via the communications link 340.

If the answer at both steps 605 and 610 is no, the process jumps to step 620, and the server monitors the PA's performance. In particular, as shown at 625, the server collects, through link 340, PA performance data which, depending upon the particular implementation, can comprise ACPR, temperature, gain, current, voltage, time, time-delay, in-phase and/or quadrature baseband signal (I and Q Signals), coefficients of the PA amplitude-amplitude (AM-AM) and/or amplitude-phase (AM-PM) curves, coefficients of the PD look-up table and/or algorithms, frequency, bandwidth, transistor junction temperatures, non-linearities, and other tangible performance characteristics of the PA. A check is then made at step 630 to determine whether the PA is working properly. If the PA is working properly, the process loops back to step 620, and monitoring continues. If the answer is no, a check is made at step 635 to determine whether a hard failure has occurred. If not, the process loops back to step 610 to determine modify the PA's performance in accordance with the data received from the PA. If a hard failure has occurred, an alarm signal is sent at step 640 to cause a repair/replacement to occur. Either alternatively or in addition to the alarm signal 640, and depending upon the PA's failure mode, the power amplifier may be remotely reconfigured as shown at step 645 to provide limited functionality at least until a repair or replacement can be made. Those skilled in the art will recognize that steps 640 and 645 can occur in either order, or substantially concurrently, and neither necessarily depends upon the other.

Figure 3:
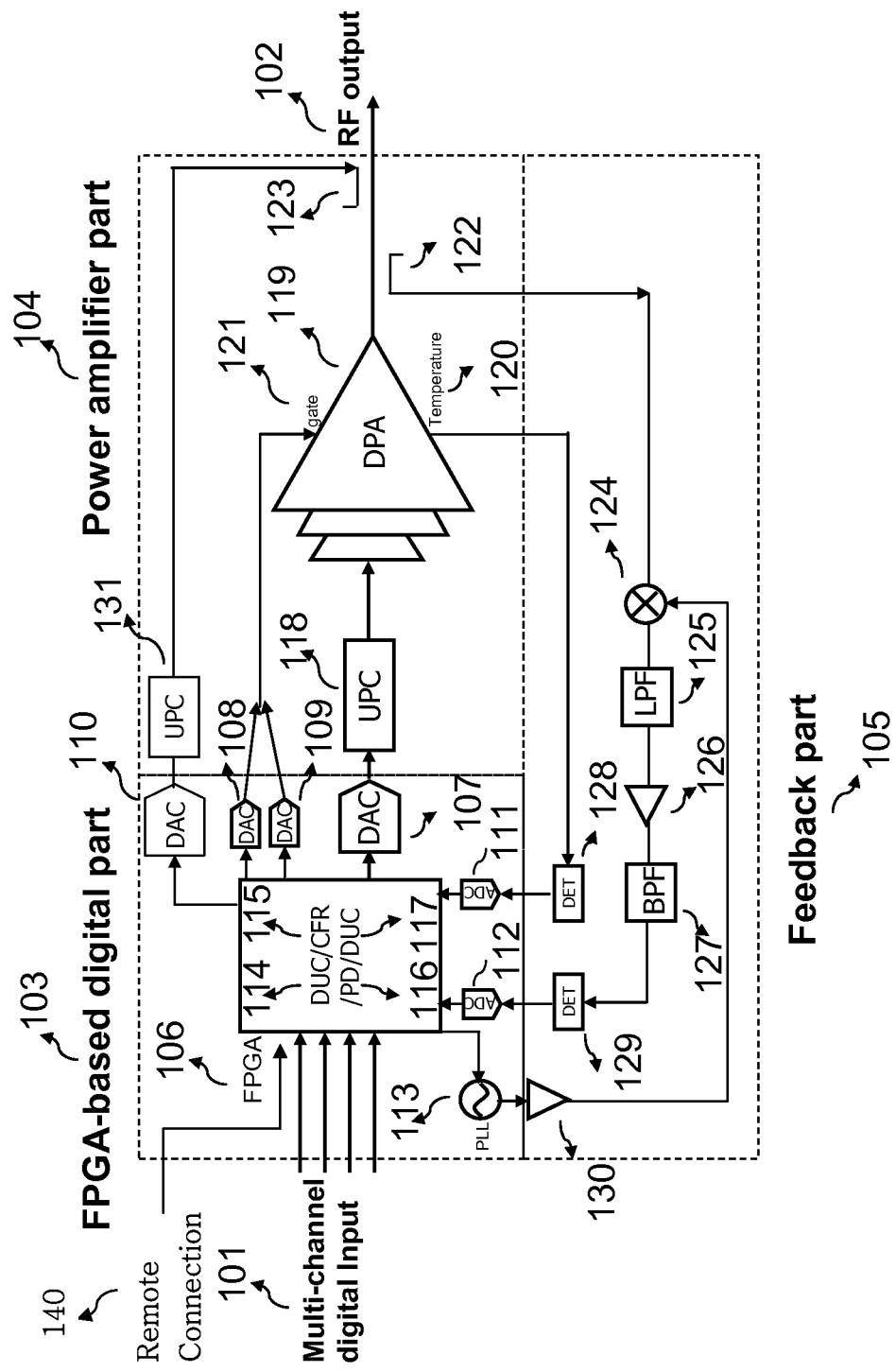
FIG. 3 is a block diagram showing a remotely reconfigurable digital hybrid mode power amplifier system for base station and repeater applications according to another embodiment of the present invention.
Figure 4:
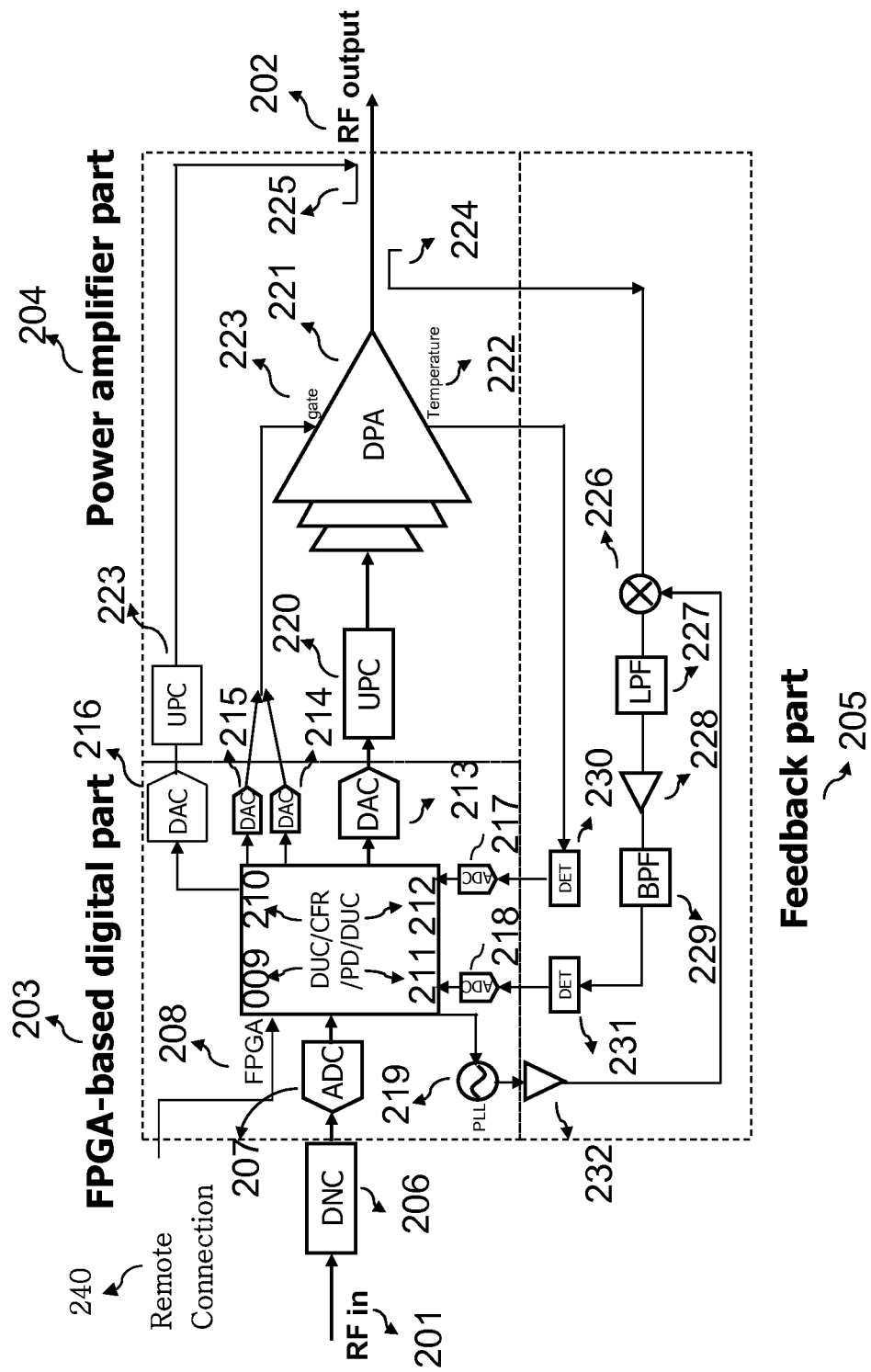
FIG. 4 is a block diagram showing another embodiment of a remotely reconfigurable digital hybrid mode power amplifier system.

Referring next to FIGS. 3 and 4, two alternative embodiments of remotely reconfigurable digital hybrid mode power amplifier systems are shown in block diagram form. Such power amplifier systems are particularly suited to use for base station and repeater applications according to an embodiment of the present invention. In each case, the FPGA-based subsystem, PA subsystem and Feedback subsystem are shown as 103/203, 104/204 and 105/205 respectively. In FIG. 3, a multi-channel input is illustrated, with remote connection 140 providing an I/O link to a remote server, not shown. In FIG. 4, RF input 201 provides an input to a down-converter 206, and again a bi-directional link to a remote server is provided at remote connection 240. It can be appreciated that, in either case, the feedback subsystem is configured to provide to the FPGA-based subsystem appropriate data characterizing the performance of the PA.

As a result, it can be appreciated that the remotely reconfigurable DHMPA system of the present invention communicate with a remote host via any suitable link including the internet, thereby providing capabilities including, depending upon the embodiment, performance monitoring, early warning failure detection, software upgrades, reconfigurability to service providers specifications (ie. # of carriers, modulation of carriers, frequency of carriers, Crest Factor Reduction, Error Vector Magnitude, ACPR, . . . ) and so forth.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A method for remotely reconfiguring a power amplifier in a wireless communications system comprising the steps of:
providing a power amplifier in a wireless communications system having multiple stages, a microprocessor, and software-defined radio capability,
providing a remote media link between a remote computer and the power amplifier to permit communications therebetween,
monitoring operating characteristics of each of the multiple stages of the power amplifier during normal operation and as a function of time, wherein said operating characteristics comprise transistor junction temperatures and coefficients of power amplifier amplitude-amplitude (AM-AM) and amplitude-phase (AM-PM) curves,
detecting changes in nonlinearities of the power amplifier as a function of time based on the operating characteristics of each of the multiple stages of the power amplifier collected during monitoring,
determining an early warning of failure of the power amplifier based on changes in the coefficients of power amplifier amplitude-amplitude (AM-AM) and amplitude-phase (AM-PM) curves as a function of time,
reporting the early warning of failure to a remote computer, and
reconfiguring the power amplifier to reduce functionality relative to normal operation as directed by the remote computer.

2. The method of claim 1 wherein the reconfiguring step comprises uploading at least one software patch.

3. The method of claim 1 wherein the operating characteristics further comprise: in-phase and quadrature baseband signals (I and Q Signals), coefficients of a predistortion look-up table, frequency, and bandwidth measurements of the power amplifier.

4. The method of claim 1 wherein monitoring operating characteristics and detecting changes in nonlinearities comprises measuring predistortion look-up table coefficients and updating a digital predistorter coupled to the power amplifier.

5. The method of claim 2 wherein the power amplifier is characterized by a first performance level prior to monitoring operating characteristics of the power amplifier and the at least one software patch reconfigures the power amplifier to operate with limited functionality characterized by a second performance level less than the first performance level.

6. A reconfigurable power amplifier having multiple stages for use in wireless communications systems comprising:
a communications link adapted to communicate with a remote computer system,
at least one detector for monitoring operating characteristics of each of the multiple stages of the power amplifier as a function of time during normal operation, wherein said operating characteristics comprise transistor junction temperatures and coefficients of power amplifier amplitude-amplitude (AM-AM) and amplitude-phase (AM-PM) curves,
a memory operable to record multiple values associated with the operating characteristics of each of the multiple stages of the power amplifier during normal operation, and
a microprocessor having software-defined radio capability and responsive to the at least one detector for communicating with the remote computer system via the communications link, operable to determine an early warning of failure of the power amplifier based on changes in the coefficients of power amplifier amplitude-amplitude (AM-AM) and amplitude-phase (AM-PM) curves collected by the at least one detector during monitoring as a function of time, and to report the early warning of failure to the remote computer system, and responsive to instructions from the remote computer for reconfiguring the power amplifier for reduced functionality relative to normal operation in response to the early warning of failure.

7. The reconfigurable power amplifier of claim 6 wherein the instructions comprise providing a software patch to the microprocessor via the communications link.

8. The reconfigurable power amplifier of claim 6 wherein the instructions comprise uploading a new operating system to the power amplifier and causing the microprocessor to install the new operating system.

9. The reconfigurable power amplifier of claim 6 further comprising a multi-channel input configurable to interface with a plurality of base stations.

10. The reconfigurable power amplifier of claim 6 further comprising a predistorter coupled to the detector and operable to receive predistortion look-up table coefficients.

11. The reconfigurable power amplifier of claim 7 wherein the power amplifier is characterized by a first performance level prior to monitoring operating characteristics of the power amplifier and the software patch reconfigures the power amplifier to operate with limited functionality characterized by a second performance level less than the first performance level.

12. The reconfigurable power amplifier of claim 9 wherein the multi-channel input is further configurable to interface with a plurality of repeater applications.

* * * * *